(12) United States Patent
Sassa

(10) Patent No.: US 10,510,994 B2
(45) Date of Patent: Dec. 17, 2019

(54) METHOD FOR MANUFACTURING ORGANIC DEVICE, AND ROLL

(71) Applicant: SUMITOMO CHEMICAL COMPANY, LIMITED, Tokyo (JP)

(72) Inventor: Shuichi Sassa, Osaka (JP)

(73) Assignee: SUMITOMO CHEMICAL COMPANY, LIMITED, Chuo-ku, Tokyo (JP)

(*) Notice: Subject to any disclaimer, the term of this patent is extended or adjusted under 35 U.S.C. 154(b) by 0 days.

(21) Appl. No.: 16/067,725

(22) PCT Filed: Dec. 22, 2016

(86) PCT No.: PCT/JP2016/088385
§ 371 (c)(1),
(2) Date: Jul. 2, 2018

(87) PCT Pub. No.: WO2017/119322
PCT Pub. Date: Jul. 13, 2017

(65) Prior Publication Data
US 2019/0006634 A1     Jan. 3, 2019

(30) Foreign Application Priority Data
Jan. 5, 2016    (JP) ................. 2016-000640

(51) Int. Cl.
| | | |
|---|---|---|
| *H01L 51/56* | (2006.01) | |
| *H01L 51/50* | (2006.01) | |
| *H05B 33/02* | (2006.01) | |
| *H05B 33/10* | (2006.01) | |
| *H01L 51/00* | (2006.01) | |
| *H01L 51/52* | (2006.01) | |

(52) U.S. Cl.
CPC .......... *H01L 51/56* (2013.01); *H01L 51/0013* (2013.01); *H01L 51/0021* (2013.01);
(Continued)

(58) Field of Classification Search
CPC . H01L 51/56; H01L 51/5253; H01L 51/0013; H01L 51/0021; H01L 51/50;
(Continued)

(56) References Cited

U.S. PATENT DOCUMENTS

2004/0201027 A1* 10/2004 Ghosh ................. H01L 51/5253
                                                           257/99
2012/0231694 A1    9/2012 Hamada et al.

FOREIGN PATENT DOCUMENTS

| CN | 102598863 A | 7/2012 |
|---|---|---|
| CN | 103262209 A | 8/2013 |

(Continued)

OTHER PUBLICATIONS

International Preliminary Report on Patentability with the translation of Written Opinion dated Jul. 19, 2018, in counterpart International Application No. PCT/JP2016/088385.

(Continued)

*Primary Examiner* — Karen Kusumakar
(74) *Attorney, Agent, or Firm* — Sughrue Mion, PLLC

(57) ABSTRACT

In a method of manufacturing an organic device, a lead portions (4A and 4B) having a gas barrier property are provided at one end and the other end in a longitudinal direction of a substrate (3). The method includes a formation step (S02, S03, or S04) of forming at least one of electrode layers (5 and 9) and an organic functional layer (7) on the substrate (3), a winding step (S05) of winding the substrate (3) in a roll shape after the formation step (S02, S03, or S04), and a storage step (S06) of storing the roll-shaped substrate (3) after the winding step (S05).

8 Claims, 8 Drawing Sheets

(52) U.S. Cl.
CPC .......... *H01L 51/50* (2013.01); *H01L 51/5253* (2013.01); *H05B 33/02* (2013.01); *H05B 33/10* (2013.01); *H01L 51/5012* (2013.01); *H01L 51/5206* (2013.01); *H01L 51/5221* (2013.01); *H01L 2251/558* (2013.01)

(58) Field of Classification Search
CPC ............. H01L 51/5221; H01L 51/5206; H01L 2251/558; H01L 51/5012; H05B 33/10; H05B 33/02
See application file for complete search history.

(56) References Cited

FOREIGN PATENT DOCUMENTS

| | | |
|---|---|---|
| JP | 2004319484 A | 11/2004 |
| JP | 2007149589 A | 6/2007 |
| JP | 2009123532 A | 6/2009 |
| JP | 2014-75318 A | 4/2014 |
| JP | 2014195070 A | 10/2014 |
| WO | 2009066718 A1 | 5/2009 |
| WO | 2011062213 A1 | 5/2011 |
| WO | 2012026363 A1 | 3/2012 |
| WO | 2012081607 A1 | 6/2012 |

OTHER PUBLICATIONS

International Search Report, dated Mar. 28, 2017 from the International Bureau in counterpart International application No. PCT/JP2016/088385.
First Office Action dated May 23, 2019 in counterpart Chinese Patent Application No. 201680077780.7 with English translation.
Communication dated Jun. 12, 2019 by the European Patent Office in application No. 16883821.7.

* cited by examiner

METHOD FOR MANUFACTURING ORGANIC DEVICE, AND ROLL

CROSS REFERENCE TO RELATED APPLICATIONS

This application is a National Stage of International Application No. PCT/JP2016/088385 filed Dec. 22, 2016, claiming priority based on Japanese Patent Application No. 2016-000640 filed Jan. 5, 2016.

TECHNICAL FIELD

The invention relates to a method of manufacturing an organic device and a roll.

BACKGROUND ART

For example, methods described in Patent Literatures 1 and 2 are known as conventional methods of manufacturing an organic device. The method of manufacturing an organic device described in Patent Literature 1 is a method of manufacturing an organic device using a roll-to-roll process in which the organic device includes at least one of a gas barrier layer, an electrode layer, and an organic material layer formed by coating of a flexible base, a protective film including a desiccant-containing layer is superimposed on the organic material layer, and the resultant product is wound after the organic material layer or a counter electrode has been formed.

In the method of manufacturing an organic device which is described in Patent Literature 2, after at least one step of an anode layer forming step, an organic functional layer forming step, and a cathode layer forming step has ended, a belt-shaped flexible substrate on which one of an anode layer, an organic compound layer, and a cathode layer has been stacked is wound in a roll shape and recovered and is stored in an inert gas atmosphere.

CITATION LIST

Patent Literature

Patent Literature 1: Japanese Unexamined Patent Application Publication No. 2009-123532
Patent Literature 2: Japanese Unexamined Patent Application Publication No. 2007-149589

SUMMARY OF INVENTION

Technical Problem

In a method of manufacturing an organic device using a flexible substrate, the substrate may be wound in a roll shape and temporarily stored after an organic functional layer or the like has been formed. At this time, the organic functional layer or the like formed on the substrate may deteriorate due to oxygen and/or moisture. Therefore, in the method of manufacturing an organic device described in Patent Literature 1, a protective film including a desiccant-containing layer is adhered to the organic material layer. However, in this manufacturing method, since a step of adhering the protective film is necessary, the process steps are complicated. In addition, since an apparatus that adheres the protective film is necessary, manufacturing costs increase. In the method of manufacturing an organic device described in Patent Literature 2, an inert gas with a low moisture concentration is used to make the atmosphere in which the roll-shaped substrate is stored have a low oxygen concentration and a low moisture concentration. However, since inert gases are not cheap, it is not possible to avoid an increase in manufacturing costs.

Therefore, an aspect of the invention provides a method of manufacturing an organic device and a roll that can reduce manufacturing costs and curb deterioration.

Solution to Problem

A method of manufacturing an organic device according to an aspect of the invention is a method of manufacturing an organic device using a belt-shaped flexible substrate in a continuous conveyance manner, in which a lead portion having a gas barrier property is provided at one end and the other end in a longitudinal direction of the substrate, the method including: a formation step of forming at least one of an electrode layer and an organic functional layer on the substrate; a winding step of winding the substrate in a roll shape after the formation step; and a storage step of storing the roll-shaped substrate after the winding step.

In the method of manufacturing an organic device according to the aspect of the invention, the belt-shaped flexible substrate which is used includes lead portions at one end and the other end in the longitudinal direction thereof. The lead portions have a gas barrier property. Accordingly, when the substrate is wound in a roll shape in the winding step, the lead portions are located inside and outside the roll. Accordingly, it is possible to prevent infiltration of oxygen and/or moisture into the electrode layer and/or the organic functional layer in the storage step due to the gas barrier property of the lead portions. In this way, in the method of manufacturing an organic device, since the electrode layer and/or the organic functional layer can be protected without using a protective film or inert gas, it is possible to reduce manufacturing costs and to curb deterioration thereof.

In one embodiment, the electrode layer may include a first electrode layer and a second electrode layer, and the formation step may include forming the first electrode layer, the organic functional layer, and the second electrode layer on the substrate in that order. Accordingly, it is possible to curb deterioration of an organic device including the first electrode layer, the organic functional layer, and the second electrode layer using the lead portions.

In one embodiment, a gas barrier layer may be formed on at least one of a front surface and a rear surface of the substrate. Accordingly, it is possible to further prevent infiltration of oxygen and/or moisture into the electrode layer and/or the organic functional layer.

In one embodiment, a gas barrier film or a metal foil may be provided in the lead portion. Accordingly, it is possible to secure the gas barrier property of the lead portion.

In one embodiment, a length of the lead portion may be greater than a length of an outer circumference of a roll which is formed by winding the substrate. Accordingly, since the outer circumference of the roll is covered with the lead portion, it is possible to more satisfactorily prevent infiltration of oxygen and/or moisture into the electrode layer and/or the organic functional layer.

In one embodiment, a thermosensitive adhesive member of which an adhesive strength increases at a temperature equal to or higher than a predetermined first temperature and the adhesive strength decreases at a temperature equal to or lower than a predetermined second temperature may be provided on one surface of both ends in a width direction of the substrate, and a heating step of heating the thermosensitive adhesive member to equal to or higher than the predetermined first temperature may be included after the formation step and before the storage step. Accordingly, since one surface (a surface on which the thermosensitive adhesive member is not provided) of the substrate and the thermosensitive adhesive member come into close contact with each other, it is possible to prevent infiltration of oxygen and/or moisture in the width direction of the substrate. Accordingly, it is possible to further protect the electrode layer and/or the organic functional layer.

In one embodiment, a low-temperature treatment step of performing low-temperature treatment so that the temperature of the thermosensitive adhesive member is equal to or lower than the predetermined second temperature may be included after the storage step and before performing a next step. Accordingly, since the adhesive strength of the thermosensitive adhesive member decreases, it is possible to detach the thermosensitive adhesive member from the substrate.

A roll according to another aspect of the invention is a roll in which a belt-shaped flexible substrate is wound, wherein at least one of an electrode layer and an organic functional layer is formed on the substrate, and a lead portion having a gas barrier property is provided at one end and the other end in a longitudinal direction of the substrate.

In the roll, the lead portion having a gas barrier property is provided at one end and the other end in the longitudinal direction of the substrate. In this configuration, it is possible to prevent infiltration of oxygen and/or moisture into the electrode layer and/or the organic functional layer due to the gas barrier property of the lead portion. In this way, in the roll, since the electrode layer and/or the organic functional layer can be protected without using a protective film or inert gas at the time of storage of the roll, it is possible to reduce manufacturing costs and to curb deterioration.

Advantageous Effects of Invention

According to the aspects of the invention, it is possible to reduce manufacturing costs and curb deterioration of an electrode layer and/or an organic functional layer.

DESCRIPTION OF EMBODIMENTS

Hereinafter, exemplary embodiments of the invention will be described in detail with reference to the accompanying drawings. In description with reference to the drawings, the same or corresponding elements will be referred to by the same reference signs and description thereof will not be repeated.

Figure 1:
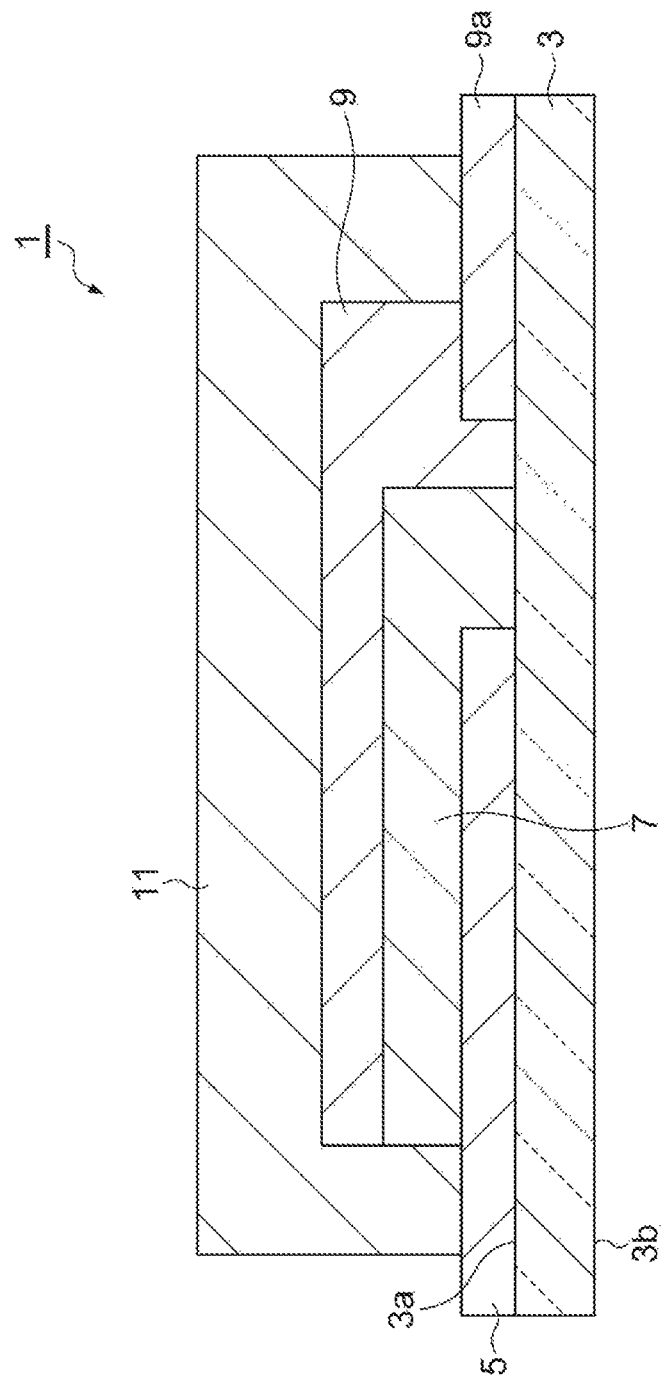
FIG. 1 is a sectional view of an organic EL element which is manufactured using a method of manufacturing an organic device according to an embodiment.

As illustrated in FIG. 1, an organic EL element (an organic device) 1 which is manufactured using a method of manufacturing an organic device according to an embodiment includes a support substrate (substrate) 3, an anode layer (a first electrode layer) 5, an organic functional layer 7, a cathode layer (a second electrode layer) 9, and a sealing layer 11.

[Support Substrate]

The support substrate 3 is formed of a resin having a light transmitting property with respect to visible light (light with a wavelength of 400 nm to 800 nm). The support substrate 3 is a film-shaped substrate (a flexible substrate, a substrate having flexibility). The thickness of the support substrate 3 ranges, for example, from 30 μm to 500 μm.

The support substrate 3 is, for example, a plastic film. Examples of the material of the support substrate 3 include polyether sulfone (PES); a polyester resin such as polyethylene terephthalate (PET) or polyethylene naphthalate (PEN); a polyolefin resin such as polyethylene (PE), polypropylene (PP), or cyclic polyolefin; a polyamide resin; a polycarbonate resin; a polystyrene resin; a polyvinyl alcohol resin; a saponified product of an ethylene vinyl acetate copolymer, a polyacrylonitrile resin; an acetal resin; a polyimide resin; and an epoxy resin.

In view of high heat resistance, a low linear expansion coefficient, and a low manufacturing cost, among the above-mentioned resins, a polyester resin and a polyolefin resin can be preferably used as the material of the support substrate 3, and a polyethylene terephthalate and a polyethylene naphthalate can be particularly preferably used. These resins may be used alone or in a combination of two or more types.

Figure 2:
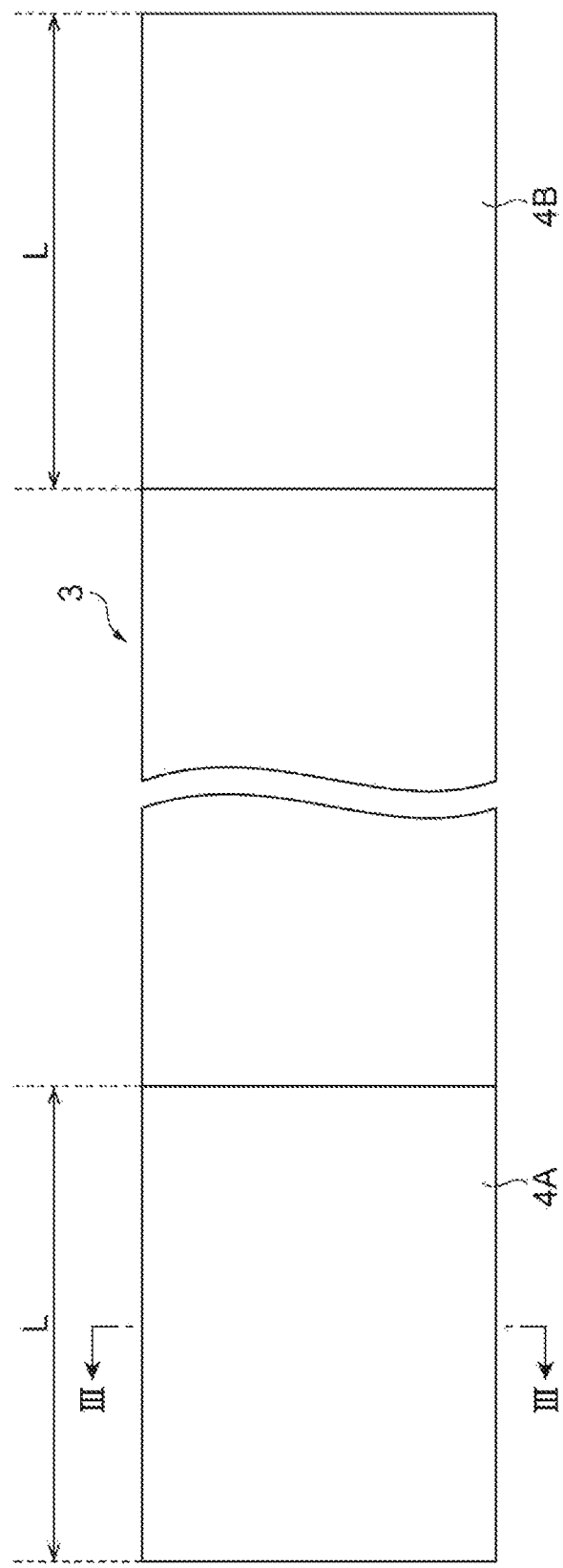
FIG. 2 is a plan view illustrating a support substrate.

As illustrated in FIG. 2, lead portions 4A and 4B are provided at one end and the other end (both ends) in a longitudinal direction of the support substrate 3. The lead portions 4A and 4B are an area which is wound on a core C (see FIG. 6) or an area which is wound on the outer circumference of a roll R (see FIG. 6) on which the support substrate 3 has been wound. The lead portions 4A and 4B may be formed integrally with the support substrate 3 or may be attached to the support substrate 3. The lead portions 4A and 4B may be formed of the same material as the support substrate 3 or may be formed of a material different from that of the support substrate 3.

The length L of each of the lead portions 4A and 4B is set to be greater than the length of the outer circumference of the roll R on which the support substrate 3 has been wound. Specifically, the length L of each of the lead portions 4A and 4B is calculated, for example, using Equation (1).

$$L = 2\pi D \tag{1}$$

In the equation, D denotes a diameter [m] of the wound roll R. The diameter D is calculated using Equation (2).

[Math. 1]

$$D = \sqrt{\frac{4tl}{\pi} + d^2} \tag{2}$$

In Equation (2), t denotes a thickness [m] of the support substrate 3, l denotes a total length [m] of the roll R, and d denotes a diameter [m] of the core C.

Figure 3:
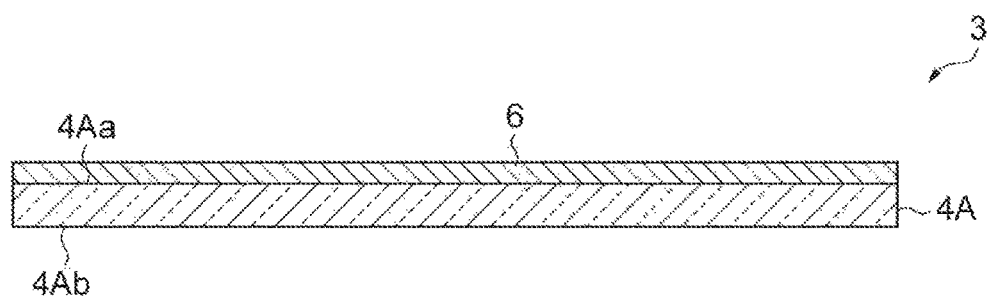
FIG. 3 is a sectional view taken along line III-II in FIG. 2.

Each of the lead portions 4A and 4B has a gas barrier property of blocking moisture and/or oxygen. Specifically, as illustrated in FIG. 3, a gas barrier layer 6 is formed in the lead portions 4A and 4B. The gas barrier layer 6 is disposed on one principal surface 4Aa of the lead portion 4A of the support substrate 3. The gas barrier layer 6 is also disposed on one principal surface 4Aa of the lead portion 4B of the support substrate 3. The gas barrier layer 6 may be disposed on the other principal surfaces 4Ab of the lead portions 4A and 4B of the support substrate 3 or may be disposed on both one principal surface 4Aa and the other principal surface 4Ab.

The gas barrier layer 6 is a gas barrier film or a metal foil. The gas barrier film is, for example, a single-layered or multi-layered thin film of an inorganic oxide such as silicon oxide, silicon nitride, silicon oxynitride, or aluminum oxide which is formed on the support substrate 3. The gas barrier film preferably has a multi-layered structure including a layer of the inorganic oxide (an inorganic layer) and a layer of an organic material (an organic layer) in order to improve brittleness. The stacking order of an inorganic layer and an organic layer is not limited, and both layers are preferably alternately stacked a plurality of times. Examples of a method of forming the gas barrier film include a vacuum vapor deposition method, a sputtering method, a reactive sputtering method, a molecular beam epitaxy method, an ion plating method, a plasma polymerizing method, an atmospheric plasma polymerizing method, a plasma CVD method, a laser CVD method, a thermal CVD method, and a coating method.

For example, a metal material such as aluminum, copper, or nickel or an alloy material such as stainless steel or an aluminum alloy can be used as the metal foil. Regarding the lead portions 4A and 4B, the lead portions 4A and 4B may be formed of a material having a gas barrier property.

[Anode Layer]

The anode layer 5 is disposed on one principal surface 3a of the support substrate 3. An electrode layer having a light transmitting property is used as the anode layer 5. A thin film of a metal oxide, a metal sulfide, a metal, or the like having high electric conductivity can be used as the electrode layer having a light transmitting property, and a thin film having high light transmittance can be preferably used. For example, a thin film formed of indium oxide, zinc oxide, tin oxide, indium tin oxide (abbreviated to ITO), indium zinc oxide (abbreviated to IZO), gold, platinum, silver, copper, or the like is used, and among these, a thin film formed of ITO, IZO, or tin oxide can be preferably used.

A transparent conductive film of an organic material such as polyaniline and derivatives thereof and polythiophene and derivatives thereof may be used as the anode layer 5. An electrode in which a metal, a metal alloy, or the like is patterned in a mesh shape or an electrode in which nanowires containing silver are formed in a network shape may be used as the anode layer 5.

The thickness of the anode layer 5 can be determined in consideration of light transmitting properties, electric conductivity, and the like. The thickness of the anode layer 5 generally ranges from 10 nm to 10 μm, preferably ranges from 20 nm to 1 μm, and more preferably ranges from 50 nm to 500 nm.

Examples of the method of forming the anode layer 5 include a vacuum vapor deposition method, a sputtering method, an ion plating method, a plating method, and application coating method.

[Organic Functional Layer]

The organic functional layer 7 is disposed on the anode layer 5 and one principal surface 3a of the support substrate 3. The organic functional layer 7 has a light emitting layer. The organic functional layer 7 mainly includes an organic material emitting fluorescence and/or phosphorescence or the organic material and a dopant material for a light emitting layer assisting the organic material. For example, the dopant material for a light emitting layer is added to improve emission efficiency or to change an emission wavelength. The organic material may be a low-molecular compound or a high-molecular compound. Examples of a light emitting material constituting the organic functional layer 7 include pigment-based materials, metal complex-based materials, polymer-based materials, or dopant materials for a light emitting layer, which will be described later.

(Pigment-Based Materials)

Examples of the pigment-based materials include cyclopentamine and derivatives thereof, tetraphenyl butadiene and derivatives thereof, triphenyl amine and derivatives thereof, oxadiazole and derivatives thereof, pyrazoloquinoline and derivatives thereof, distyrylbenzene and derivatives thereof, distyrylarylene and derivatives thereof, pyrrole and derivatives thereof, thiophene compounds, pyridine compounds, perinone and derivatives thereof, perylene and derivatives thereof, oligothiophene and derivatives thereof, oxadiazole dimer and derivatives thereof, pyrazoline dimer and derivatives thereof, quinacridone and derivatives thereof, and coumarin and derivatives thereof.

(Metal Complex-Based Materials)

Examples of the metal complex-based materials include metal complexes having a rare-earth metal such as Tb, Eu, or Dy or Al, Zn, Be, Ir, or Pt as a center metal and having oxadiazole, thiadiazole, phenyl pyridine, phenyl benzimidazole, or a quinolone structure, or the like as a ligand. Examples of the metal complexes include metal complexes emitting light in a triplet excited state such as iridium complex and platinum complex, aluminum quinolinol complex, benzoquinolinol beryllium complex, benzooxazolyl zinc complex, benzothiazole zinc complex, azomethyl zinc complex, porphyrin zinc complex, and phenanthroline europium complex.

(Polymer-Based Materials)

Examples of the polymer-based materials include polyparaphenylene vinylene and derivatives thereof, polythiophene and derivatives thereof, polyparaphenylene and derivatives thereof, polysilane and derivatives thereof, polyacetylene and derivatives thereof, polyfluorene and derivatives thereof, polyvinyl carbazole and derivatives thereof and materials obtained by polymerizing the pigment-based materials or the metal complex-based materials.

(Dopant Materials for Light Emitting Layer)

Examples of the dopant materials for a light emitting layer include perylene and derivatives thereof, coumarin and derivatives thereof rubrene and derivatives thereof, quinacridone and derivatives thereof, squarylium and derivatives thereof, porphyrin and derivatives thereof, styryl-based pigments, tetracene and derivatives thereof, pyrazolone and derivatives thereof, decacyclene and derivatives thereof, and phenoxazone and derivatives thereof.

The thickness of the organic functional layer 7 generally ranges from 2 nm to 200 nm. The organic functional layer 7 is formed, for example, by a coating method using a coating liquid (for example, ink) containing the above-mentioned light emitting materials. A solvent of the coating liquid containing a light emitting material is not particularly limited as long as it can dissolve the light emitting material.

[Cathode Layer]

The cathode layer 9 is formed on the organic functional layer 7 and one principal surface 3a of the support substrate 3. The cathode layer 9 is electrically connected to an extraction electrode 9a. The extraction electrode 9a is disposed on one principal surface 3a of the support substrate 3. The extraction electrode 9a is disposed with a predetermined gap from the anode layer 5. The thickness of the extraction electrode 9a is equal to the thickness of the anode layer 5. The material of the extraction electrode 9a is the same as the material of the anode layer 5.

For example, an alkali metal, an alkali earth metal, a transition metal, or a metal belonging to Group 13 of the periodic table can be used as the material of the cathode layer 9. Specific examples of the material of the cathode layer 9 include metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, alloys of two or more types of these metals, alloys of one or more types of these metals and at least one type of gold, silver, platinum, copper, manganese, titanium, cobalt, nickel, tungsten, and tin, and graphite or graphite intercalation compounds. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

For example, a transparent conductive electrode formed of a conductive metal oxide and a conductive organic material can be used as the cathode layer 9. Specific examples of the conductive metal oxide include indium oxide, zinc oxide, tin oxide, ITO, and IZO. Specific examples of the conductive organic material include polyaniline and derivatives thereof and polythiophene and derivatives thereof. The cathode layer 9 may be formed as a stacked body in which two or more layers are stacked. An electron injection layer may be used as the cathode layer 9.

The thickness of the cathode layer 9 is set in consideration of electric conductivity and durability. The thickness of the cathode layer 9 generally ranges from 10 nm to 10 μm, preferably ranges from 20 nm to 1 μm, and more preferably ranges from 50 nm to 500 nm.

Examples of the method of forming the cathode layer 9 include a vacuum vapor deposition method, a sputtering method, a laminating method of thermally compressing a metal sheet, and a coating method.

[Sealing Layer]

The sealing layer 11 is disposed in a highest part of the organic EL element 1. The sealing layer 11 is bonded by an adhesive layer (not illustrated). The sealing layer 11 is formed of a metal foil, a barrier film in which a barrier functional layer is formed on a front surface or a rear surface of a transparent plastic film or on both surfaces thereof, a film in which a metal having a barrier property is stacked on a glass thin-film having flexibility or a plastic film, or the like, and has a gas barrier function, particularly, a moisture barrier function. The metal foil is preferably formed of copper, aluminum, or stainless steel in view of the barrier property. It is preferable that the thickness of the metal foil be large in view of suppression of pin holes, and the thickness preferably ranges from 15 μm to 50 μm in consideration of flexibility.

[Method of Manufacturing Organic Device]

A method of manufacturing an organic EL element 1 having the above-mentioned configuration will be described below with reference to FIG. 4.

Figure 5:
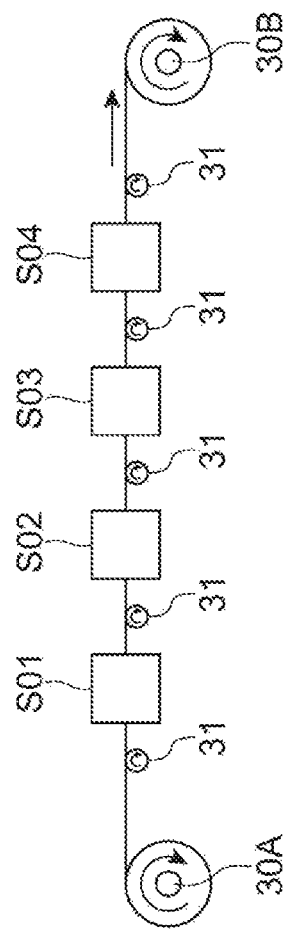
FIG. 5 is a diagram schematically illustrating the method of manufacturing an organic device using a roll-to-roll process.

In the method of manufacturing an organic EL element 1, as conceptually illustrated in FIG. 5, a roll-to-roll process (a continuous conveyance process) is employed. When an organic EL element 1 is manufactured in a roll-to-roll process, a long flexible support substrate 3 suspended between an unwinding roll 30A and a winding roll 30B is continuously conveyed by conveyance rollers 31 and the layers are sequentially formed from the support substrate 3 side. In FIG. 5, steps from a substrate drying step S01 to a cathode layer forming step S04 are illustrated as an example.

Figure 4:
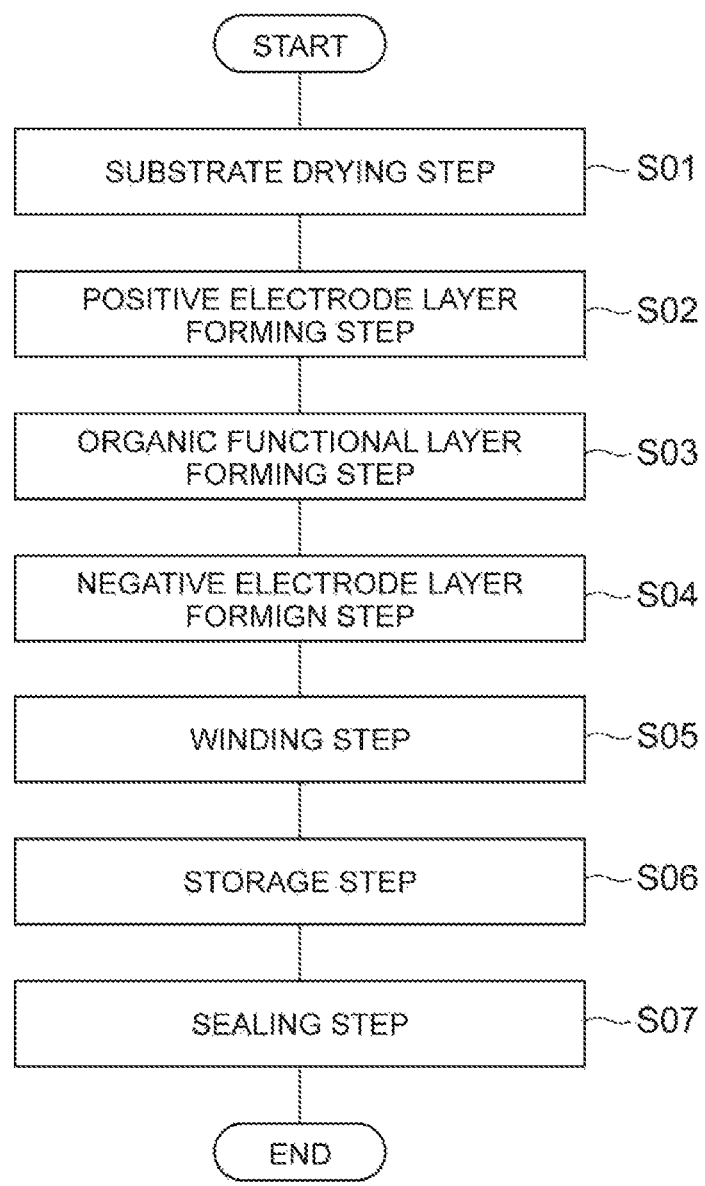
FIG. 4 is a flowchart illustrating the method of manufacturing an organic device.

When an organic EL element 1 is manufactured as illustrated in FIG. 4, first, the support substrate 3 is heated to dry the support substrate 3 (substrate drying step S01). Then, the anode layer 5 and an extraction electrode 9a are formed on the dried support substrate 3 (one principal surface 3a) (anode layer forming step (formation step) S02). The anode layer 5 (the extraction electrode 9a) can be formed using the formation method which has been described above for the anode layer 5.

Subsequently, an organic functional layer 7 is formed on the anode layer 5 (organic functional layer forming step (formation step) S03). The organic functional layer 7 can be formed using the formation method which has been described above for the organic functional layer 7. Then, a cathode layer 9 is formed on the organic functional layer 7 (cathode layer forming step (formation step) S04). The cathode layer 9 can be formed using the formation method which has been described above for the cathode layer 9.

Figure 6:
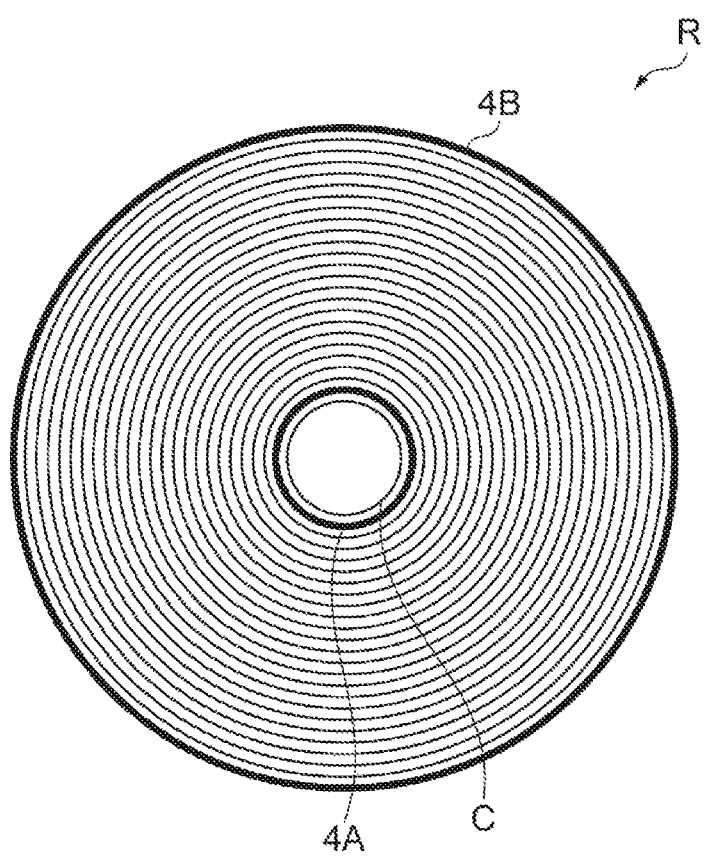
FIG. 6 is a side view of a roll on which a support substrate is wound.

Subsequently, the support substrate 3 on which the cathode layer 9 is formed is wound in a roll shape (winding step S05). When the support substrate 3 is wound on a core C as illustrated in FIG. 6, a roll R is formed. In the roll R, the lead portion 4A is wound on the core C. The lead portion 4B is wound on the outer circumference of the roll R. Accordingly, in the roll R, the inside is covered with the lead portion 4A, and the outside is covered with the lead portion 4B. The roll R is stored, for example, in a storage cabinet (storage step S06).

Subsequently, the roll R stored in the storage step S06 is prepared, and the organic functional layer 7 and the cathode layer 9 formed on the support substrate 3 are sealed by the sealing layer 11 (sealing step S07). Specifically, the roll R is prepared, the support substrate 3 is suspended between the unwinding roll 30A and the winding roll 30B, and the sealing layer 11 is bonded thereto. In this way, the organic EL element 1 is manufactured.

As described above, in the method of manufacturing an organic device according to this embodiment, the belt-shaped flexible support substrate 3 which is used includes the lead portions 4A and 4B at one end and the other end in the longitudinal direction thereof. The lead portions 4A and 4B have a gas barrier property. Accordingly, when the support substrate 3 is wound in a roll shape in the storage step S06, the lead portions 4A and 4B are disposed inside and outside the roll R. Accordingly, the organic functional layer 7 and the cathode layer 9 are protected from oxygen and/or moisture due to the gas barrier property of the lead portions 4A and 4B. In this way, in the method of manufacturing an organic device, since the organic functional layer 7 and the cathode layer 9 can be protected without using a protective film or inert gas, it is possible to reduce manufacturing costs and to curb deterioration.

In this embodiment, the anode layer 5, the organic functional layer 7, and the cathode layer 9 are formed in that order on the support substrate 3 and then the support substrate 3 is wound and stored. Accordingly, it is possible to curb deterioration of the organic EL element (an organic device) including the anode layer 5, the organic functional layer 7, and the cathode layer 9 using the lead portions 4A and 4B.

In this embodiment, the gas barrier layer 6 formed of a gas barrier film or a metal foil is provided in the lead portions 4A and 4B. Accordingly, it is possible to secure the gas barrier property of the lead portions 4A and 4B.

In this embodiment, the length of the lead portions 4A and 4B is set to be larger than the length of the outer circumference of the roll R which is formed by winding the support substrate 3. Accordingly, since the outer circumference of the roll R is covered with the lead portion 4A or the lead portion 4B, it is possible to more satisfactorily prevent infiltration of oxygen and/or moisture into the organic functional layer 7 and the cathode layer 9.

The invention is not limited to the above-mentioned embodiments and can be modified in various forms. For example, in the embodiment, an organic EL element 1 in which the organic functional layer 7 including a light emitting layer is disposed between the anode layer 5 and the cathode layer 9 has been described. However, the configuration of the organic functional layer 7 is not limited thereto. The organic functional layer 7 may have the following configurations.

(a) anode layer/light emitting layer/cathode layer (b) anode layer/hole injection layer/light emitting layer/cathode layer (c) anode layer/hole injection layer/light emitting layer/electron injection layer/cathode layer (d) anode layer/hole injection layer/light emitting layer/electron transport layer/electron injection layer/cathode layer (e) anode layer/hole injection layer/hole transport layer/light emitting layer/cathode layer (f) anode layer/hole injection layer/hole transport layer/light emitting layer/electron injection layer/cathode layer (g) anode layer/hole injection layer/hole transport layer/light emitting layer/electron transport layer/electron injection layer/cathode layer (h) anode layer/light emitting layer/electron injection layer/cathode layer (i) anode layer/light emitting layer/electron injection layer/electron injection layer/cathode layer Here, the symbol "/" means that layers described before and after the symbol "/" are stacked adjacent to each other.

Known materials can be used as the materials of a hole injection layer, a hole transport layer, an electron transport layer, and an electron injection layer. The hole injection layer, the hole transport layer, the electron transport layer, and the electron injection layer can be formed, for example, using a similar coating method to the organic functional layer 7.

The organic EL element 1 may have a single organic functional layer 7 or may have two or more organic functional layers 7. In any one of the layer configurations (a) to (i), when a stacked structure which is disposed between the anode layer 5 and the cathode layer 9 is defined as "structure unit A," a layer configuration described below in (j) can be exemplified as the configuration of the organic EL element including two light emitting layers 7. The layer configurations of two of (structure unit A) may be the same as or different from each other.

(j) anode layer/(structure unit A)/charge generation layer/(structure unit A)/cathode layer Here, the charge generation layer is a layer that generates holes and electrons when an electric field is applied. Examples of the charge generation layer include thin films formed of vanadium oxide, ITO, or molybdenum oxide.

When "(structure unit A)/charge generation layer" is defined as "structure unit B," a layer configuration described below in (k) can be exemplified as the configuration of the organic EL element including three or more organic functional layers 7.

(k) anode layer/(structure unit B)$_x$/(structure unit A)/cathode layer

The symbol "x" denotes an integer which is equal to or greater than 2, and "(structure unit B)$_x$" denotes a stacked body in which x stages of (structure units B) are stacked. The layer configurations of (Structure units B) may be the same as or different from each other.

The organic EL element may be constituted by directly stacking a plurality of organic functional layers 7 instead of forming the charge generating layer.

In the above-mentioned embodiment, an example in which the anode layer 5 is formed on the support substrate 3 using a roll-to-roll process has been described. However, the anode layer 5 may be formed on the support substrate 3 in advance, the long support substrate 3 having the anode layer 5 formed thereon, which is suspended between the unwinding roll 30A and the winding roll 30B, may be continuously conveyed by the conveyance rollers 31, and the steps for manufacturing an organic EL element 1 may be performed thereon.

The substrate drying step S01 is performed in the above-mentioned embodiment, but the substrate drying step S01 may not be performed.

In the above-mentioned embodiment, an example in which the winding step S05 and the storage step S06 are performed after the cathode layer forming step S04 has been described. However, the winding step and the storage step may be performed after the organic functional layer forming step S03. The winding step and the storage step can be performed at any time (in the middle of each step).

In addition to the above-mentioned embodiment, a gas barrier layer may be provided on at least one of one principal surface (front surface) 3a and the other principal surface (rear surface) 3b of the support substrate 3. According to this configuration, it is possible to further prevent infiltration of oxygen and/or moisture into the organic functional layer 7 and the cathode layer 9.

In addition to the above-mentioned embodiment, the method of manufacturing an organic device can employ the following method. A method of manufacturing an organic device according to another embodiment will be described below with reference to FIGS. 7 and 8. Since the steps from a substrate drying step S11 to a winding step S15 in FIG. 8 are the same as the steps from the substrate drying step S01 to the winding step S05 in the above-mentioned embodiment, detailed description thereof will not be repeated.

Figure 7:
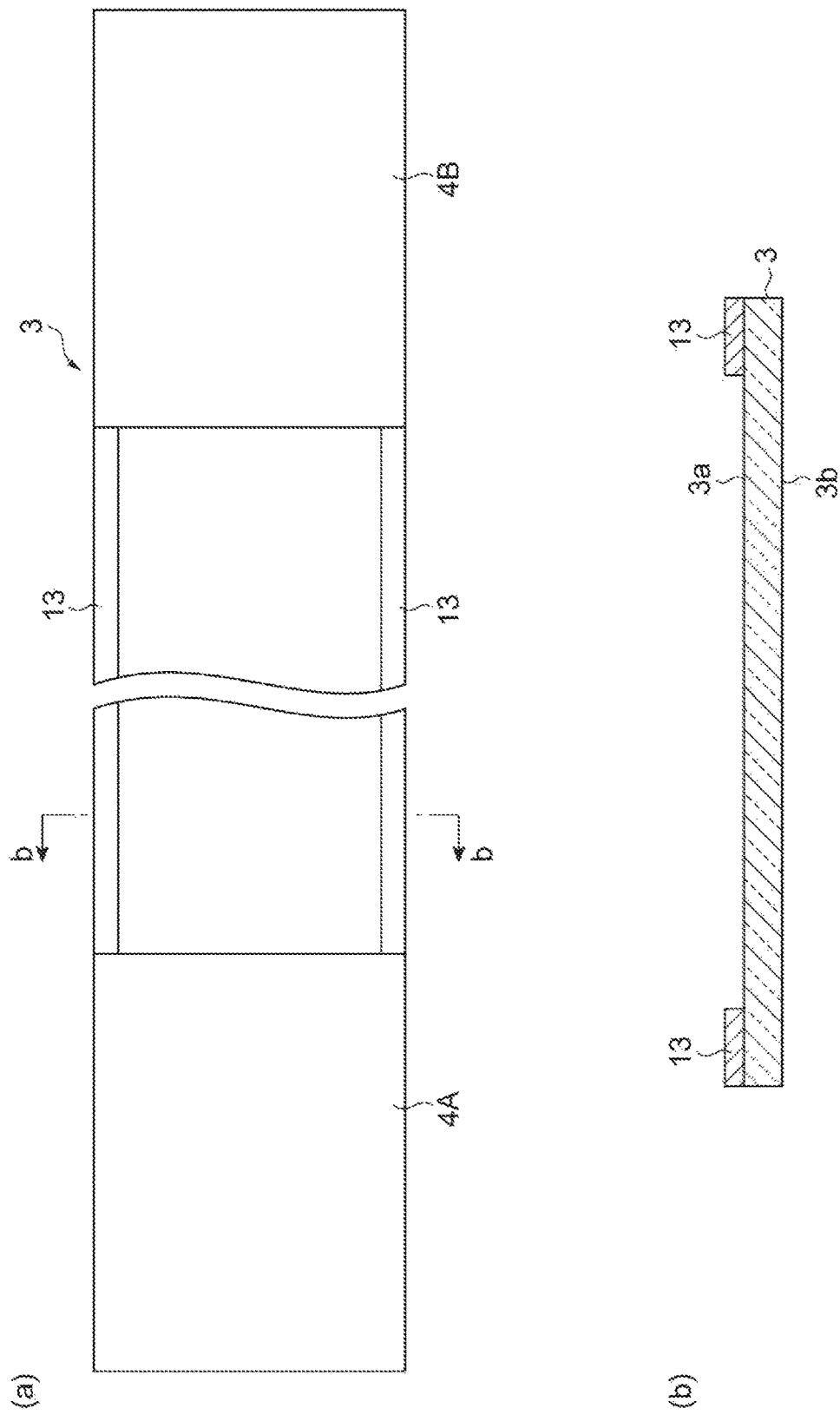
FIG. 7 is a diagram illustrating a support substrate which is used for a method of manufacturing an organic device according to another embodiment.
Figure 8:
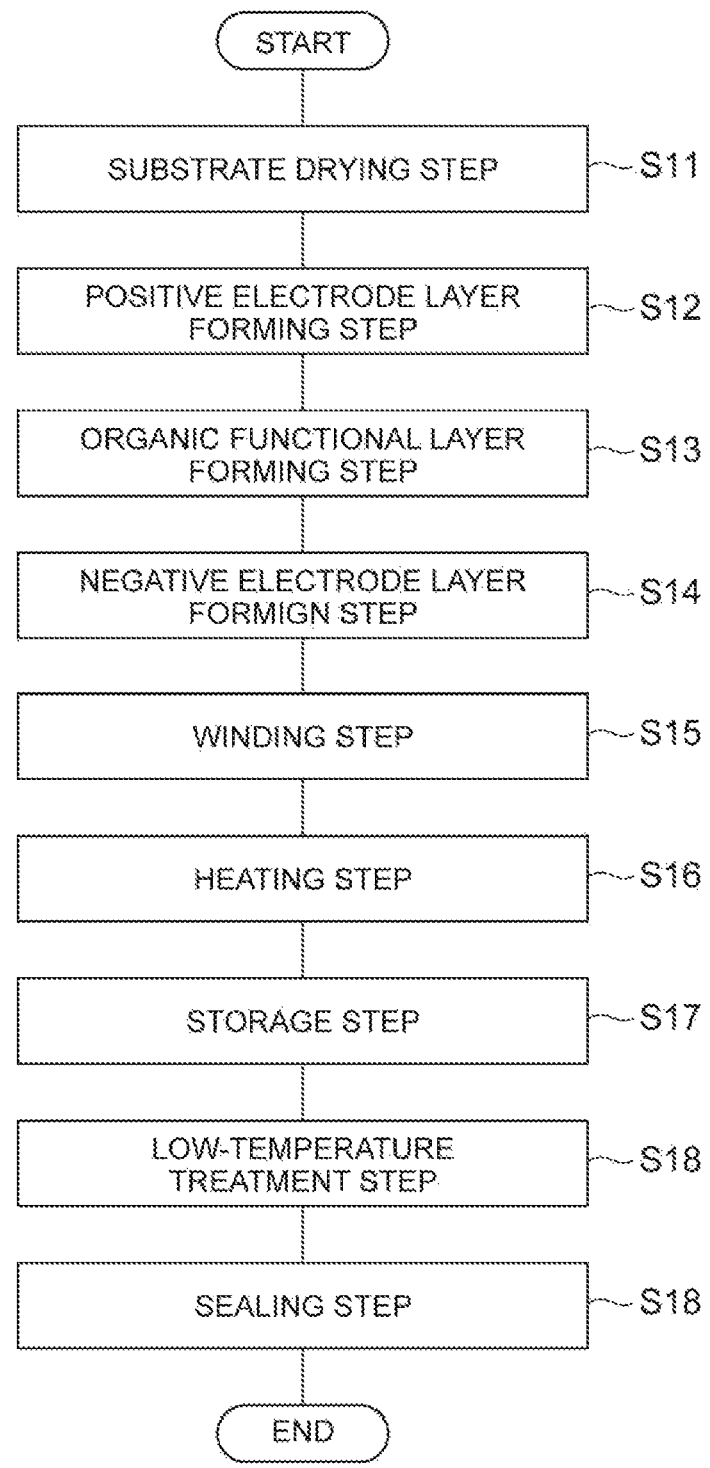
FIG. 8 is a flowchart illustrating the method of manufacturing an organic device according to another embodiment.

As illustrated in FIG. 7, a thermosensitive adhesive sheet (a thermosensitive adhesive member) 13 is provided on the support substrate 3. The thermosensitive adhesive sheet 13 is disposed on the principal surfaces 3a of both end portions in the width direction of the support substrate 3 and is adhered in the longitudinal direction. The thermosensitive adhesive sheet 13 has a characteristic by which an adhesive strength thereof increases at a temperature equal to or higher than a predetermined first temperature and the adhesive strength thereof decreases at a temperature equal to or lower than a predetermined second temperature. Specifically, the thermosensitive adhesive sheet 13 exhibits adhesiveness, for example, at a temperature equal to or higher than 50° C., and the adhesive strength decreases at a temperature equal to or lower than 3° C. (it becomes detachable from another member).

After the winding step S15, a heating process is performed on the roll R (heating step S16). In the heating step S16, the roll R is heated, for example, by inputting the roll R into a heating room such as an oven with a temperature of 50° C. or higher. By heating the roll R, adhesiveness of the thermosensitive adhesive sheet 13 is exhibited (increased), and the thermosensitive adhesive sheet 13 comes in close contact with the other principal surface 3b of the support substrate 3. Then, the roll R is stored, for example, in a storage cabinet (storage step S17).

Subsequently, the roll R stored in the storage step S17 is prepared and low-temperature treatment is performed on the roll R (low-temperature treatment step S18). In the low-temperature treatment step S18, low-temperature treatment is performed on the roll R, for example, by inputting the roll R into a cooling room with a temperature of 3° C. or lower. By performing the low-temperature treatment on the roll R, the adhesive strength of the thermosensitive adhesive sheet 13 decreases and the thermosensitive adhesive sheet 13 is detached from the other principal surface 3b of the support substrate 3. Then, the organic functional layer 7 and the cathode layer 9 formed on the support substrate 3 are sealed by the sealing layer 11 (sealing step S19). Specifically, the roll R subjected to the low-temperature treatment is prepared, the support substrate 3 is suspended between the unwinding roll 30A and the winding roll 30B, and the sealing layer 11 is bonded thereto. In this way, the organic EL element 1 is manufactured.

In the above-mentioned method of manufacturing an organic device, since the thermosensitive adhesive sheet 13 comes into close contact with the other principal surface 3b of the support substrate 3, it is possible to prevent oxygen and/or moisture in the width direction of the support substrate 3. Accordingly, it is possible to further protect the organic functional layer 7 and the cathode layer 9 and to curb deterioration thereof.

In the above-mentioned embodiment, an example in which the whole roll R is heated in the heating step S16 has been described, but both end portions of the roll R to which the thermosensitive adhesive sheet 13 is bonded may be heated by a spot heater. An example in which the low-temperature treatment is performed on the whole roll R in the low-temperature treatment step S18 has been described above, but cold wind may be blown to the thermosensitive adhesive sheet 13 when the roll R is unwound.

In the above-mentioned embodiment, an example in which the roll R is heated in the heating step S16 after the roll R is formed in the winding step S15 has been described. However, the thermosensitive adhesive sheet 13 may be heated, for example, using a roll laminator before the support substrate 3 is wound in a roll shape. That is, the winding step may be performed after the heating step.

In the above-mentioned embodiment, an organic EL element has been exemplified as an organic device. The organic device may be an organic thin-film transistor, an organic photodetector, an organic thin-film solar cell, or the like.

REFERENCE SIGNS LIST

1 Organic EL element (organic device)
3 Support substrate (substrate)
3a One principal surface (front surface)
3b Other principal surface (rear surface)
4A, 4B Lead portion
5 Anode layer (first electrode layer)
7 Organic functional layer
9 Cathode layer (second electrode layer)
13 Thermosensitive adhesive sheet (thermosensitive adhesive member)
R Roll
S02, S12 Positive layer forming step (formation step)
S03, S13 Organic functional layer forming step (formation step)
S04, S14 Cathode layer forming step (formation step)
S05, S15 Winding step
S06, S17 Storage step
S16 Heating step
S18 Low-temperature treatment step

The invention claimed is:

1. A method of manufacturing an organic device using a belt-shaped flexible substrate in a continuously-conveyed manner, the substrate being provided with lead portions having a gas barrier property at a one end and another end in a longitudinal direction, the method comprising:
   a formation step of forming at least one of an electrode layer and an organic functional layer on the substrate in a region not provided with the lead portions;
   a winding step of winding the substrate in a roll shape after the formation step; and
   a storage step of storing the roll-shaped substrate after the winding step.

2. The method of manufacturing an organic device according to claim 1, wherein the electrode layer includes a first electrode layer and a second electrode layer, and
   wherein the formation step includes forming the first electrode layer, the organic functional layer, and the second electrode layer on the substrate in this order.

3. The method of manufacturing an organic device according to claim 1, wherein a gas barrier layer is formed on at least one of a front surface and a rear surface of the substrate.

4. The method of manufacturing an organic device according to claim 1, wherein a gas barrier film or a metal foil is provided in the lead portion.

5. The method of manufacturing an organic device according to claim 1, wherein a length of the lead portion is greater than a length of an outer circumference of a roll which is formed by winding the substrate.

6. The method of manufacturing an organic device according to claim 1, wherein a thermosensitive adhesive member of which an adhesive strength increases at a temperature equal to or higher than a predetermined first temperature and the adhesive strength decreases at a temperature equal to or lower than a predetermined second temperature is provided on one surface of both ends in a width direction of the substrate, and
   wherein a heating step of heating the thermosensitive adhesive member to equal to or higher than the predetermined first temperature is included after the formation step and before the storage step.

7. The method of manufacturing an organic device according to claim 6, wherein a low-temperature treatment step of performing low-temperature treatment so that the temperature of the thermosensitive adhesive member is equal to or lower than the predetermined second temperature is included after the storage step and before performing a next step.

8. A roll in which a belt-shaped flexible substrate is wound,
   wherein at least one of an electrode layer and an organic functional layer is formed on the substrate, wherein a lead portion having a gas barrier property is provided at one end and the other end in a longitudinal direction of the substrate, and wherein the substrate has regions provided with the lead portions, and a region not provided with the lead portions.

* * * * *